United States Patent
Warren

(10) Patent No.: US 8,499,220 B2
(45) Date of Patent: Jul. 30, 2013

(54) SYSTEMS AND METHODS FOR RE-DESIGNATING MEMORY REGIONS AS ERROR CODE CORRECTED MEMORY REGIONS

(75) Inventor: Robert W. Warren, Loveland, CO (US)

(73) Assignee: LSI Corporation, San Jose, CA (US)

( * ) Notice: Subject to any disclaimer, the term of this patent is extended or adjusted under 35 U.S.C. 154(b) by 572 days.

(21) Appl. No.: 12/774,065

(22) Filed: May 5, 2010

(65) Prior Publication Data

US 2011/0060967 A1  Mar. 10, 2011

Related U.S. Application Data

(60) Provisional application No. 61/240,542, filed on Sep. 8, 2009.

(51) Int. Cl.
G11C 29/00 (2006.01)
(52) U.S. Cl.
USPC ........................................................ 714/763
(58) Field of Classification Search
USPC ........................................ 714/763, 784, 773
See application file for complete search history.

(56) References Cited

U.S. PATENT DOCUMENTS

| | | | |
|---|---|---|---|
| 7,127,549 B2 | 10/2006 | Sinclair | |
| 7,310,699 B2 | 12/2007 | Sinclair | |
| 2005/0172067 A1 | 8/2005 | Sinclair | |
| 2005/0283647 A1 * | 12/2005 | Ishidoshiro et al. | 714/5 |
| 2007/0028040 A1 | 2/2007 | Sinclair | |
| 2009/0067303 A1 | 3/2009 | Poo | |
| 2009/0172280 A1 | 7/2009 | Trika et al. | |
| 2011/0041005 A1 * | 2/2011 | Selinger | 714/6 |

FOREIGN PATENT DOCUMENTS

KR   10/2009/0013394   2/2009

OTHER PUBLICATIONS

U.S. Appl. No. 12/473,454, filed May 28, 2009, Dreifus et al.
U.S. Appl. No. 12/691,797, filed Jan. 22, 2010, Warren et al.
U.S. Appl. No. 12/691,819, filed Jan. 22, 2010, Warren, et al.
U.S. Appl. No. 12/716,257, filed Mar. 2, 2010, Warren, Robert.
U.S. Appl. No. 12/716,259, filed Mar. 2, 2010, Warren, Robert.
U.S. Appl. No. 12/716,262, filed Mar. 2, 2010, Warren, Robert.
U.S. Appl. No. 12/774,055, filed May 5, 2010, Warren, Robert.
U.S. Appl. No. 12/716,265, filed Mar. 2, 2010, Warren, Robert.
U.S. Appl. No. 12/772,005, filed Apr. 3, 2010, Warren, et al.
U.S. Appl. No. 12/774,077, filed May 5, 2010, Warren, Robert.

* cited by examiner

*Primary Examiner* — Charles Ehne
(74) *Attorney, Agent, or Firm* — Hamilton DeSanctis & cha

(57) ABSTRACT

Various embodiments of the present invention provide systems, methods and circuits for memories and utilization thereof. As one example, a memory system is disclosed that includes a flash memory device and a flash access circuit. The flash access circuit is operable to perform an error code encoding algorithm on a data set to yield an error code, to write the data set to the flash memory device at a first location, and to write the error code to the flash memory device at a second location.

20 Claims, 5 Drawing Sheets

SYSTEMS AND METHODS FOR RE-DESIGNATING MEMORY REGIONS AS ERROR CODE CORRECTED MEMORY REGIONS

CROSS REFERENCE TO RELATED APPLICATIONS

The present application claims priority to (is a non-provisional of) U.S. Pat. App. No. 61/240,542, entitled "Systems and Methods for Extending Flash Memory Life Using Region Grouping and System Level Error Correction Encoding Cycle", and filed Sep. 8, 2009 by Warren. The entirety of the aforementioned provisional patent application is incorporated herein by reference for all purposes.

BACKGROUND OF THE INVENTION

The present inventions are related to systems and methods for extending flash memory lifecycle, and more particularly to systems and methods for utilizing error correction methods in relation to a flash memory.

Flash memories have been used in a variety of devices where information stored by the device must be maintained even when power is lost to the device. A typical flash memory device exhibits a number of cells that can be charged to four distinct voltage levels representing two bits of data stored to the cell. By doing this, the memory density of a given flash device can be increased dramatically for the cost of a few additional comparators and a reasonable increase in write logic. Currently, there is a trend toward further increasing the number of bits that may be stored in any given cell by increasing the number of distinct voltage levels that may be programmed to the cell. For example, there is a trend toward increasing the number of distinct voltage levels to eight so that each cell can hold three data bits. While the process of increasing the number of bits stored to any given flash memory cell allows for increasing bit densities, it can result in a marked decline in the lifecycle of the flash memory. This decline in the lifecycle of a memory device limits its use in various memory systems where the number of writes is expected to be significant.

Hence, for at least the aforementioned reason, there exists a need in the art for advanced systems and methods for implementing memory systems utilizing flash memory devices.

BRIEF SUMMARY OF THE INVENTION

The present inventions are related to systems and methods for extending flash memory lifecycle, and more particularly to systems and methods for utilizing error correction methods in relation to a flash memory.

Various embodiments of the present invention provide methods for accessing a memory device. Such methods include providing a non-volatile memory device that has a plurality of memory regions; identifying a subset of the plurality of memory regions as un-allocated; determining a health status of the subset of the plurality of memory regions; and based at least in part on the health status of the subset of the plurality of memory regions, identifying the subset of the plurality of memory regions as an error encoded region. In some cases, the plurality of the memory regions are flash memory regions. The health status of the subset of the plurality of memory regions may be, but is not limited to: a number of remaining good blocks in the first of the plurality of memory regions, a percentage of remaining good blocks in the first of the plurality of good regions, or a percentage of remaining good cells in the first of the plurality of good regions.

In some instances of the aforementioned embodiments, the subset of the plurality of memory regions is a first of the plurality of memory regions and the error encoded region is a first error encoded region. In such instances, the methods further include receiving a data set; identifying a second of the plurality of memory regions that is un-allocated; determining that the second of the plurality of memory regions is a second error encoded region; performing an error code encoding algorithm on the data set to yield an error code; and writing the data set and the error code to the second error encoded region. In some cases, the error code encoding algorithm is a Reed Solomon error correction encoding algorithm. In various cases, the methods further include allocating a portion of the second of the plurality of memory regions to receive the data set. The portion of the second of the plurality of memory regions is the size of the data set plus the error code.

In some instances of the aforementioned embodiments, the subset of the plurality of memory regions is a first of the plurality of memory regions, and the methods further include: receiving a data set; identifying a second of the plurality of memory regions that is un-allocated; determining that the second of the plurality of memory regions is a non-error encoded region; and writing the data set to the second error encoded region. In some cases, the methods further include allocating a portion of the second of the plurality of memory regions to receive the data set. The portion of the second of the plurality of memory regions is the size of the data set.

In other instances of the aforementioned embodiments, the subset of the plurality of memory regions is a first of the plurality of memory regions, and the methods further include receiving a read request; identifying a second of the plurality of memory regions holding the data set corresponding to the read request; determining that the second of the plurality of memory regions is a non-error encoded region; and accessing the data set from the second portion of the plurality of memory regions. In yet other instances of the aforementioned embodiments, the subset of the plurality of memory regions is a first of the plurality of memory regions and the error encoded region is a first error encoded region. In such cases, the methods further include: receiving a read request; identifying a second of the plurality of memory regions holding the data set corresponding to the read request; determining that the second of the plurality of memory regions is a second error encoded region; accessing the data set and a corresponding error code from the second portion of the plurality of memory regions; and performing an error code decoding using the data set and the error code. At least one bit of the data set is corrected. In some cases, the error code decoding algorithm is a Reed Solomon error correction decoding algorithm.

Other embodiments of the present invention provide methods for accessing a memory device. Such methods include: receiving a data set; identifying a subset of a plurality of memory regions that is un-allocated; determining that the subset of the plurality of memory regions is an error encoded region; performing an error code encoding algorithm on the data set to yield an error code; and writing the data set and the error code to the error encoded region. In some cases, the methods further include: determining a health status of the subset of the plurality of memory regions; and based at least in part on the health status of the subset of the plurality of memory regions, indicating the subset of the plurality of memory regions as the error encoded region.

Yet other embodiments of the present invention provide memory systems that include a plurality of flash memory regions and an access circuit. The access control circuit is operable to: identify a subset of the plurality of flash memory regions as un-allocated; determine a health status of the subset of the plurality of flash memory regions; and indicate the subset of the plurality of memory regions as an error encoded region based at least in part on the health status of the subset of the plurality of memory regions. In some instances of the aforementioned embodiments, the subset of the plurality of flash memory regions is a first of the plurality of flash memory regions and the error encoded region is a first error encoded region. In such instances, the access circuit is further operable to: receive a data set; identify a second of the plurality of flash memory regions that is un-allocated; determine that the second of the plurality of flash memory regions is a second error encoded region; performing an error code encoding algorithm on the data set to yield an error code; and writing the data set and the error code to the second error encoded region. In some cases, the error code encoding algorithm is a Reed Solomon error correction encoding algorithm.

In various instances of the aforementioned embodiments, the subset of the plurality of flash memory regions is a first of the plurality of flash memory regions. In such instances, the access circuit is further operable to: receive a data set; identify a second of the plurality of flash memory regions that is un-allocated; determine that the second of the plurality of flash memory regions is a non-error encoded region; and writing the data set to the second error encoded region. In some cases, the access circuit is further operable to allocate a portion of the second of the plurality of memory regions to receive the data set. The portion of the second of the plurality of memory regions is the size of the data set. In some instances of the aforementioned embodiments, the subset of the plurality of flash memory regions is a first of the plurality of flash memory regions. The access circuit is further operable to: receive a read request; identify a second of the plurality of memory regions holding the data set corresponding to the read request; determine that the second of the plurality of memory regions is a second error encoded region; access the data set and a corresponding error code from the second portion of the plurality of memory regions; and perform an error code decoding using the data set and the error code, wherein at least one bit of the data set is corrected.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for extending flash memory lifecycle, and more particularly to systems and methods for utilizing error correction methods in relation to a flash memory.

Flash memory devices degrade as a function of the number of times they are accessed. Typically, a flash memory device is rated based upon the number of write accesses that can be supported before the device fails. To assure that memory cells within a flash memory degrade at approximately the same rate, various wear leveling algorithms are utilized. Such wear leveling algorithms move data within the flash memory device to distribute the number of write accesses more evenly between cells. Further, flash memory devices often include unused cells that may be used in place of cells that exhibit early failure. By implementing these approaches, the lifecycle of a flash memory device can be extended.

Figure 1:
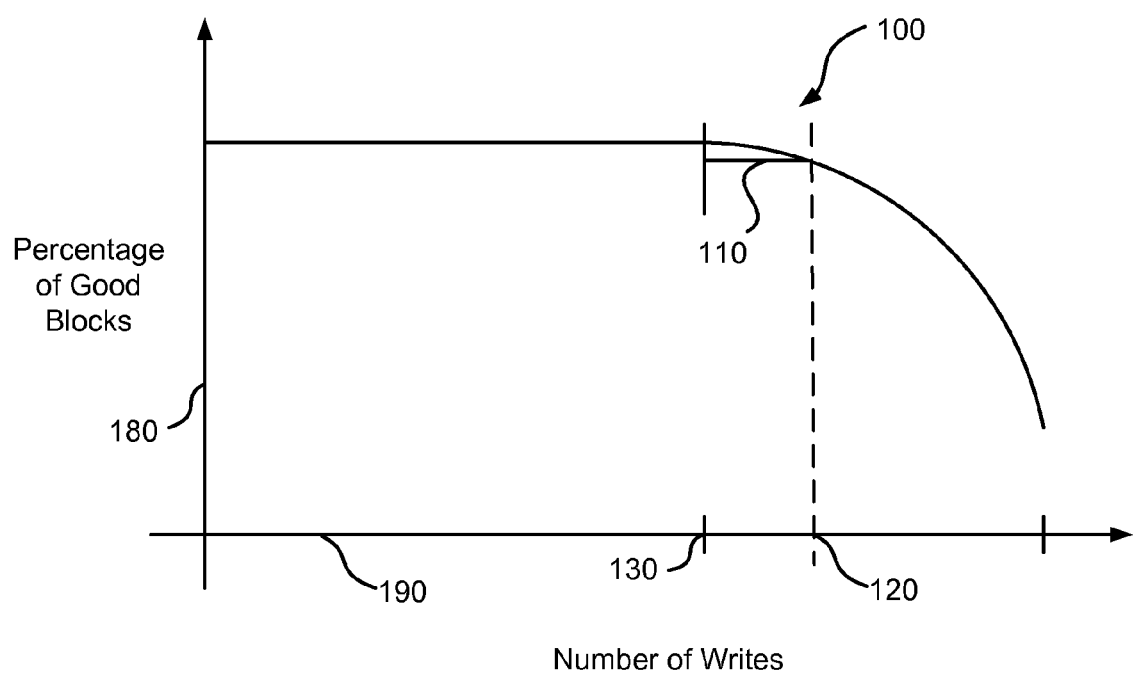
FIG. 1 graphically depicts the lifecycle of a prior art flash memory device by showing the relationship between a percentage of remaining good blocks in the flash memory device verses the number of writes to the flash memory device.

Turning to FIG. 1, a graph 100 depicts the lifecycle of a prior art flash memory device by showing the relationship between a percentage of remaining good blocks 180 in the flash memory device verses the number of writes 190 to the flash memory device. As shown, the percentage of remaining good blocks remains relatively constant until the number of writes reaches a value 130. At this point, the percentage of good blocks begins to decrease in proportion to the number of writes. By replacing exhausted blocks with backup blocks, the lifecycle of the flash memory device is extended by a number of writes indicated as element 110. Where the number of writes equals a value 120, the backup blocks have been used, and the flash memory device becomes unreliable. Element 110 corresponds to the number of writes between value 120 and value 130.

Various embodiments of the present invention utilize an error correction encoding circuit as a front end to a flash memory device to further extend the usable lifecycle of a flash memory device. In some embodiments of the present invention, the error correction encoding circuit is operable to encode write data using Reed Solomon encoding, and to decode read data using Reed Solomon decoding. The error correction encoding circuit may selectively augment a data set to be written to the memory space based upon a determination that the memory has degraded to a predetermined level. The predetermined level may be a percentage of usable blocks remaining in the memory space, or some other metric.

Figure 2A:
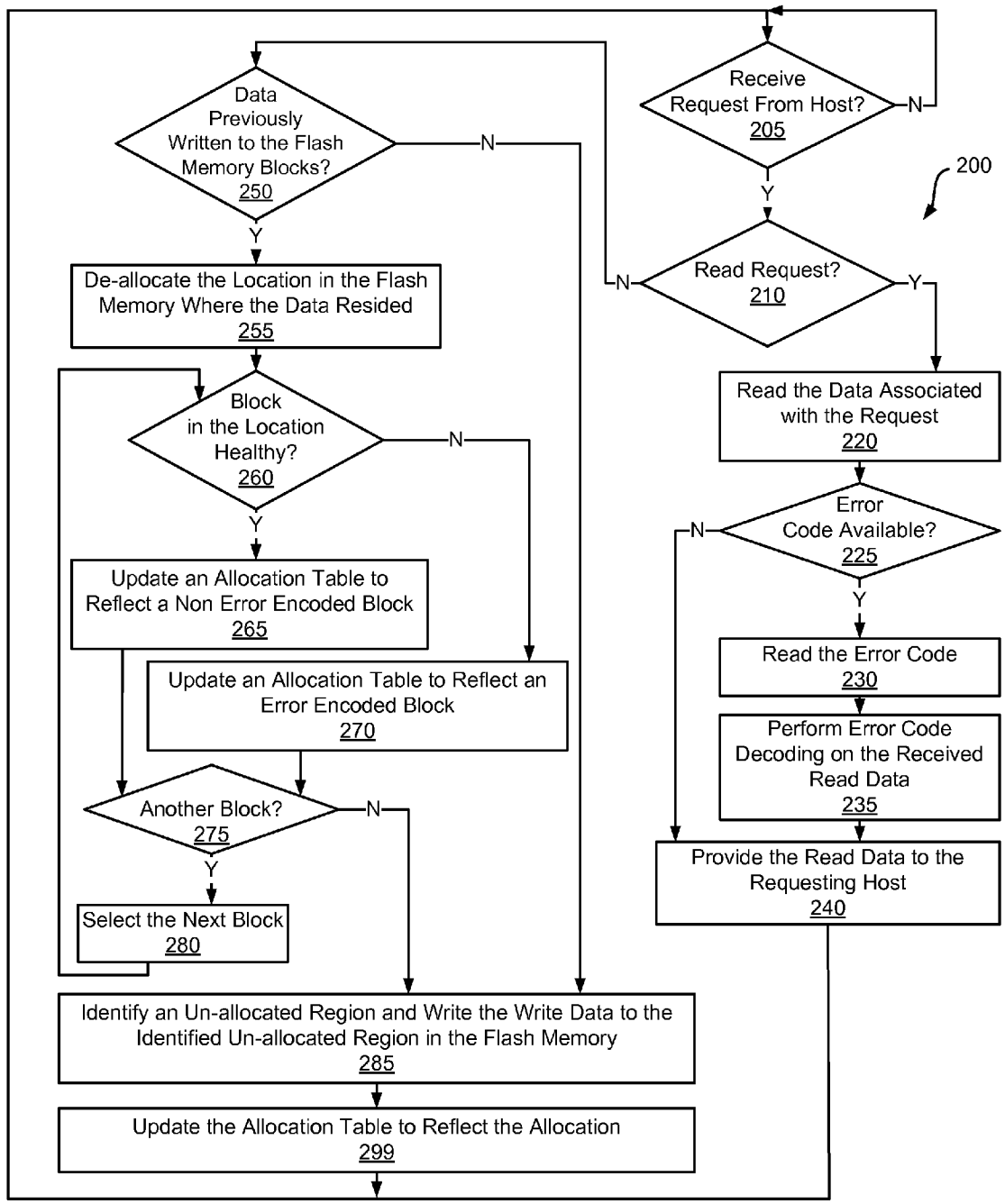
FIGS. 2*a*-2*b* are flow diagrams showing a method in accordance with various embodiments of the present invention for implementing error correction processing in relation to a flash memory device.

Turning to FIG. 2*a*, a flow diagram 200 shows a method in accordance with various embodiments of the present invention for implementing adaptive error correction processing in relation to a flash memory device in accordance with various embodiments of the present invention. Following flow diagram 200, it is determined whether a request has been received from a host (block 205). Such a request may be indicated, for example, by assertion of one or more interface signals provided by the host to a flash access circuit. In turn, it is determined whether the request is a request to read or a request to write a flash memory device associated with the flash access circuit (block 210). This determination may be made based on, for example, the assertion level of a read/write request interface signal from the host to the flash access circuit.

Where a write request is received (block 210), is it determined whether the write data was previously written to the flash memory blocks and that the new write data supersedes the previously written data (block 250). Where it is determined that the write data was previously written (e.g., the write data was read from the memory, modified, and is being written back to the memory) (block 250), the region of memory that held the previous version of the write data is de-allocated (block 255). This may include, for example, updating an allocation table in a flash access device to indicate that the respective region is now de-allocated. In addition, it is determined whether a block of the recently de-allocated region is healthy (block 260). This may include, for example, determining whether the percentage of good cells within the block is above a defined threshold. Where the region is not healthy (block 260), the allocation table is updated to indicate that the block is an error encoded block (block 270). Otherwise, the allocation table is updated to indicate that the block is a non-error encoded block (block 265). These indications are used as described in relation to the flow diagram of FIG. 2b to determine whether error encoding will be applied to write data or not. This process of determining the health of blocks in the recently de-allocated region continues until all of the blocks in the de-allocated region have been processed (block 275). Where one or more blocks remain to be checked (block 275), the next block in the region is selected (block 280), and the processes of blocks 260-270 are repeated.

Next, an un-allocated region of the memory of sufficient size to hold the write data is identified, and the write data is written to the identified un-allocated region in the flash memory (block 285). Writing the write data includes selectively performing an error encoding algorithm on the data to yield an error code, and selectively writing either a combination of the write data and the error code to an allocated memory region or just the write data to the memory region.

Figure 2B:
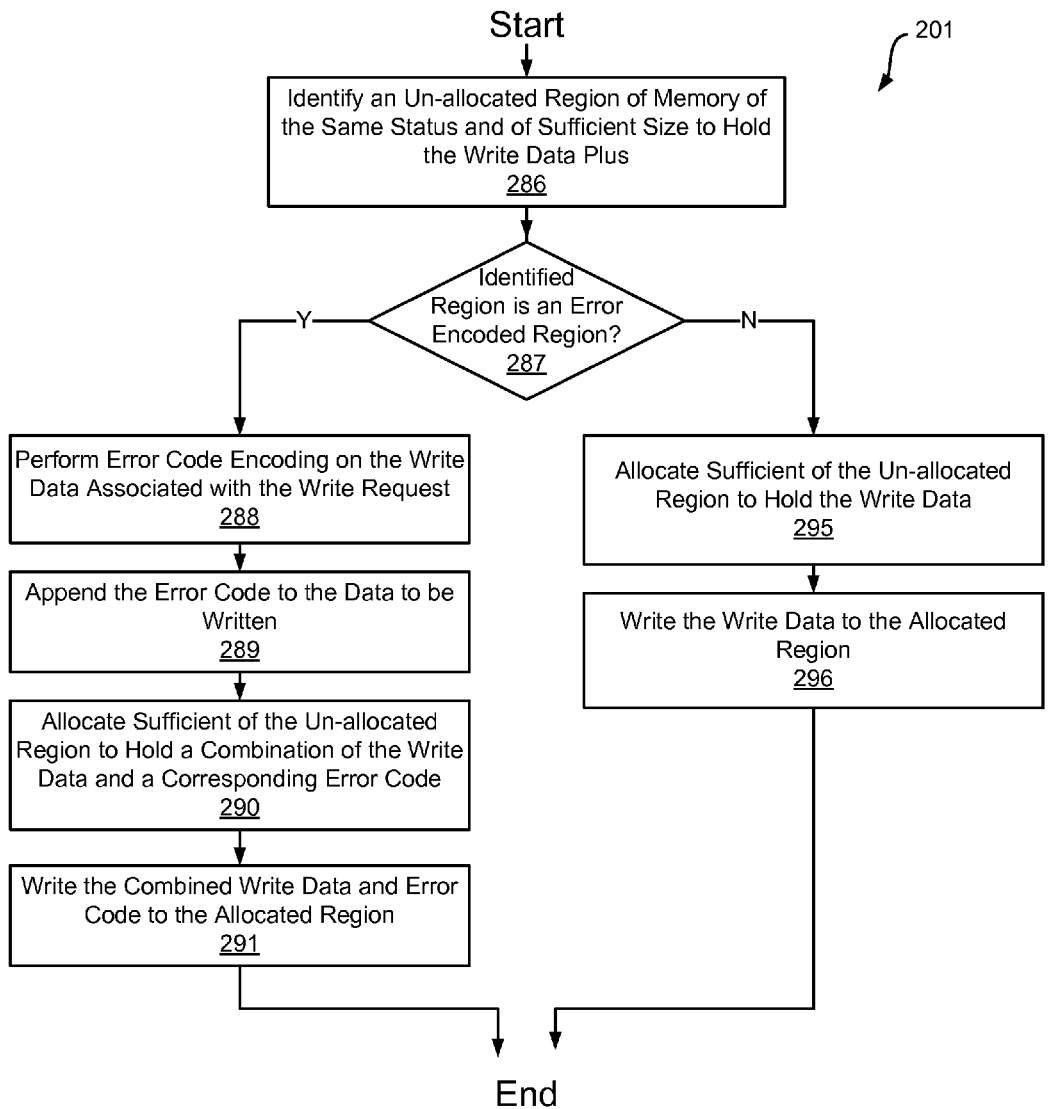

Turning to FIG. 2b, a flow diagram 201 depicts a method in accordance with some embodiments of the present invention for identifying an un-allocated region of memory, and writing a write data set to the identified un-allocated region. Of note, flow diagram 201 may be used in place of block 285 of flow diagram 200. Following flow diagram 201, an un-allocated region five to ten percent larger than that required to hold the write data is identified (block 286). The five to ten percent excess is identified in the event that it is determined that an error code will be generated in relation to the particular write data. Of note, the extra space may be particularly tailored to the size of an expected error code, and may be more or less than the five to ten percent depending upon the error encoding algorithm that is applied. The identified region is of the same status—either an error encoded region (i.e., a less healthy region) or a non-error encoded region (i.e., a more healthy region).

Where it is determined that the identified region is a non-error encoded region (block 287), a portion of the identified un-allocated region of size sufficient to hold the write data is allocated (block 295). Determination of whether the region is an error encoded region or a non-error encoded region may be determined by accessing an allocation table that identifies respective regions as allocated/un-allocated and as error encoded/non-error encoded. The write data is then written to the allocated region without any corresponding error code encoding data (block 296).

Alternatively, where it is determined that the identified region is an error encoded region (block 287), error code encoding is performed on the data associated with the write request (block 288). Again, determination of whether the region is an error encoded region or a non-error encoded region may be determined by accessing an allocation table that identifies respective regions as allocated/un-allocated and as error encoded/non-error encoded. Such error code encoding may be any encoding known in the art where an error correction code is generated for a corresponding data set. As one example, the error code encoding may be a relatively simple parity checksum generation, or a more complex Reed Solomon error correction encoding. Based upon the disclosure provided herein, one of ordinary skill in the art will recognize a variety of error code encodings that may be performed in relation to different embodiments of the present invention. The error code generated in block 288 is appended to the write data to which it corresponds (block 289). A portion of the identified un-allocated region (i.e., from block 286) of size sufficient to hold the combination of the write data and the error code is allocated (block 290), and the combination of the write data and the error code is written to the allocated region of the flash memory device (block 291). Returning to flow diagram 200 of FIG. 2a, once the identification of the un-allocated region and the write are completed (block 285), an allocation table that tracks the regions of the flash memory is updated to reflect the allocation performed in block 291 or block 290 (block 299).

Again, referring to flow diagram 200 of FIG. 2a, where the write data was not previously written (e.g., the write data is new) (block 250), an un-allocated region of the memory of sufficient size to hold the write data is identified, and the write data is written to the identified un-allocated region in the flash memory (block 285). Returning to FIG. 2b, an un-allocated region five to ten percent larger than that required to hold the write data is identified (block 286). The five to ten percent excess is identified in the event that it is determined that an error code will be generated in relation to the particular write data. Of note, the extra space may be particularly tailored to the size of an expected error code, and may be more or less than the five to ten percent depending upon the error encoding algorithm that is applied. The identified region is of the same status—either an error encoded region (i.e., a less healthy region) or a non-error encoded region (i.e., a more healthy region).

Where it is determined that the identified region is a non-error encoded region (block 287), a portion of the identified un-allocated region of size sufficient to hold the write data is allocated (block 295). Determination of whether the region is an error encoded region or a non-error encoded region may be determined by accessing an allocation table that identifies respective regions as allocated/un-allocated and as error encoded/non-error encoded. The write data is then written to the allocated region without any corresponding error code encoding data (block 296).

Alternatively, where it is determined that the identified region is an error encoded region (block 287), error code encoding is performed on the data associated with the write request (block 288). Again, determination of whether the region is an error encoded region or a non-error encoded region may be determined by accessing an allocation table that identifies respective regions as allocated/un-allocated and as error encoded/non-error encoded. Such error code encoding may be any encoding known in the art where an error correction code is generated for a corresponding data set. As one example, the error code encoding may be a relatively simple parity checksum generation, or a more complex Reed Solomon error correction encoding. Based upon the disclosure provided herein, one of ordinary skill in the art will recognize a variety of error code encodings that may be performed in relation to different embodiments of the present invention. The error code generated in block 288 is appended to the write data to which it corresponds (block 289). A portion of the identified un-allocated region (i.e., from block 286) of size sufficient to hold the combination of the write data and the error code is allocated (block 290), and the combination of the write data and the error code is written to the allocated region of the flash memory device (block 291). Returning to flow diagram 200 of FIG. 2*a*, once the identification of the un-allocated region and the write are completed (block 285), an allocation table that tracks the regions of the flash memory is updated to reflect the allocation performed in block 291 or block 290 (block 299).

Alternatively, where a read request is received (block 210), data from the location identified in the read request is accessed from the flash memory device (block 220). It is then determined if an error code is available for the read data (block 225). This determination may be made by reading the allocation table updated in blocks 265, 270 that indicates whether the region from which the data was read as either error encoded or non-error encoded. Where an error code is not available (block 225), the received read data is forwarded to the requesting host (block 240), and the read process ends.

Alternatively, where an error code is available (block 225), the error code associated with the data is read from the flash memory device (block 230). This error code is then used to perform error code decoding on the received read data (block 235). Such error code decoding is operable to correct one or more bit errors in the data retrieved from the flash memory device. As one example, the error code decoding may utilize a set of parity check equations to identify and/or correct one or more bits in the received data. As another example, the error code decoding may be a Reed Solomon decoding that is operative to identify and/or correct one or more bits in the received data. Based upon the disclosure provided herein, one of ordinary skill in the art will recognize a variety of error code encodings that may be performed in relation to different embodiments of the present invention. The corrected data set is then provided to the requesting host (block 240), and the read process completes.

Figure 3:
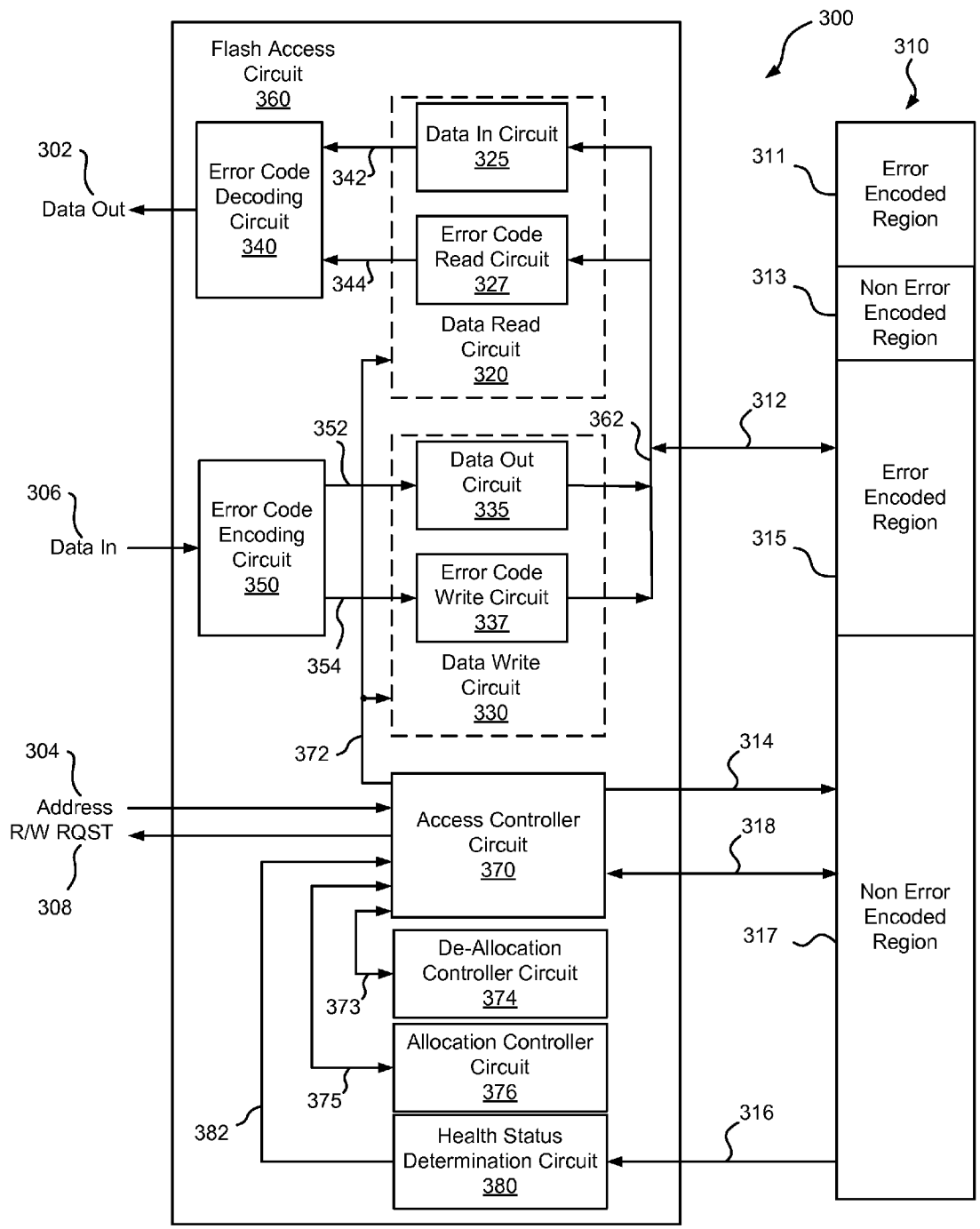
FIG. 3 shows an error correction enhanced flash memory system in accordance with one or more embodiments of the present invention.

Turning to FIG. 3, an error correction enhanced flash memory system 300 is shown in accordance with one or more embodiments of the present invention. As shown, error correction enhanced flash memory system 300 includes a standard flash memory device 310 that is capable of storing data that is provided to it via a flash access circuit 360. Of note, flash access circuit 360 may be implemented on a separate semiconductor package from flash memory device 310 allowing for a system level solution utilizing standard flash memory devices. Alternatively, flash access circuit 360 may be implemented on the same package as flash memory device 310. Also, it should be noted that while flash memory device 310 is depicted as a single flash memory device, in various embodiments of the present invention, flash access circuit 360 may be designed to support several flash memory devices arranged in a bank. Based upon the disclosure provided herein, one of ordinary skill in the art will recognize a variety of configurations that may be supported in accordance with different embodiments of the present invention.

Flash access circuit 360 is disposed between a host (not shown) and flash memory device 310. The host may be, but is not limited to, a microprocessor or interface device that is responsible for accessing data from a memory system. Based on the disclosure provided herein, one of ordinary skill in the art will recognize a variety of hosts that may be used in relation to embodiments of the present invention. Flash access circuit 360 receives a read/write request signal 308 and an address 304 from a host. Read/write request signal 308 is asserted high when a read from flash memory device 310 at a location corresponding to address 304 is requested. When the requested read data is available from flash memory device 310, it is provided via a data out interface 302. Alternatively, read/write request signal 308 is asserted low when a write to flash memory device 310 at a location corresponding to address 304 is requested. The data written to flash memory device 310 is received via a data in interface 306.

Flash access circuit 360 includes an error code decoding circuit 340, an error code encoding circuit 350, a data read circuit 320, a data write circuit 330, an access controller circuit 370, a health status determination circuit 380, a de-allocation controller circuit 374, and an allocation controller circuit 376. Health status determination circuit 380 receives a status indicator 316 from flash memory device 310, and uses status indicator 316 to determine a percentage of usable cells within respective blocks that remain in flash memory device 310. As the cells of flash memory device 310 deteriorate over its lifetime, status indicator 316 will indicate this reduction as flash memory device 310 is used. Health status determination circuit 380 provides a percentage available output 382 to access controller circuit 370.

Error code encoding circuit 350 receives a data input via data in interface 306, and performs an encoding to generate an error code corresponding to the received data input. The generated error code is written by error code encoding circuit 350 to an error code write circuit 337 via an interface 354. The received data is written by error code encoding circuit 350 to a data out circuit 335 via an interface 352.

In one particular embodiment of the present invention, the error code is a multi-bit parity check sum as are known in the art. In such an embodiment, error code encoding circuit 350 implements a parity check algorithm. Such parity check sums may be designed to be less than five percent of the data to which it corresponds. In other embodiments of the present invention, the error code is a Reed Solomon error code as are known in the art. Use of a Reed Solomon error code may be desirable where clustered errors that are not easily detectable and/or correctable using other error correction encoding such as, for example, BCH error coding. In such embodiments, error code encoding circuit 350 implements a Reed Solomon encoder. Such Reed Solomon error codes may be designed to be less than five percent of the data to which it corresponds.

Data out circuit 335 is operable to write the data received via data in interface 306 to flash memory device 310 via data buses 362, 312. Access to the data buses 362, 312 is granted by access controller circuit 370 as more fully described below. Error code write circuit 337 writes the generated error code to flash memory device 310 under the direction of access controller circuit as more fully described below. It should be noted that in some cases the write of the generated error code is conditional and does not always occur. In some cases, the address in flash memory device 310 to which data out circuit 335 writes the data precedes the address to which an appended error code is written by error code write circuit 337. In such cases, the address space for the data and the error code is contiguous. It should be noted that in some embodiments of the present invention, non-contiguous address spaces may be used to receive the combination of the write data and the corresponding error code.

Data read circuit 320 receives read data from flash memory device 310 via data buses 362, 312. Read data and corresponding error code availability on data buses 362, 312 is indicated to read data circuit 320 by access controller circuit 370 as more fully described below. Data in circuit 325 receives the read data from data bus 362 and provides the received data to error code decoding circuit 340 via an interface 342. Error code read circuit 327 retrieves any available error code from data bus 362 and provides the error code to error code decoding circuit 340 via an interface 344. Where no error code is available, error code read circuit 327 indicates such to error code decoding circuit 340 via interface 344.

Error code decoding circuit 340 performs an error correction on the data received from data in circuit 325 using error code received from error code circuit 327. Where, for example, the error code is a parity checksum value generated by error code encoding circuit 350, error code decoding circuit uses the checksum to correct any errors in the data received form data in circuit 325. As another example, where the error code is a Reed Solomon error code, error code decoding circuit 340 performs Reed Solomon decoding on the data received from data in circuit 325 to correct any errors. Ultimately, the error corrected data is provided to the host via data out interface 302. Where no error code is available in relation to the data received via data in circuit 325, error code decoding circuit 340 provides the received data to the host via data out interface 302 without performing any decoding.

Access controller circuit 370 controls the operation of flash access circuit 360. In particular, access controller 370 modifies address 304 to yield a corresponding address 314 that is provided to flash memory device 310. Any address transformation circuit known in the art may be used to perform the address transformation appropriate for the particular system in which flash access circuit 360 is implemented and for the particular characteristics of flash memory device 310. In addition, access controller circuit provides interface control signals 318 to flash memory device 310. The combination of address 314 and interface control signals 318 provide access to flash memory device 310. Based on the disclosure provided herein, one of ordinary skill in the art will recognize various interfaces that may be supported by different flash memory devices. The combination of address 314 and interface control signals 318 may be tailored to match such interfaces depending upon the needs of a particular design.

In addition, access controller circuit 370 controls access to an internal data bus 262 that is connected to flash memory device 310 via a data bus 312. In particular, access controller circuit 370 provides a set of control signals 372 to both data read circuit 320 and data write circuit 330. Control signals 372 indicate when read data is available on data bus 362 to data read circuit 320, and data in circuit 325 accesses the information based on control signals 372. Control signals 372 also indicate to data read circuit 320 whether error code associated with the previously read data is available, and if available, when the error code is available on data bus 362. When available, error code read circuit 327 accesses the information based on control signals 372. Control signals 372 also indicate when data bus 362 is available to accept write data. When available, data out circuit 335 provides write data to data bus 362 that is written to flash memory device 310 in accordance with the combination of address 314 and interface control signals 318. The data is ultimately written to a selected region of flash memory device 310 (e.g., a region either identified as an error encoded region 311, 315, or a non-error encoded region 313, 317). Similarly, when appropriate (e.g., health status determination circuit 380 indicates that the percentage of good blocks is below a defined threshold), error code write circuit 337 provides the error code generated by error code encoding circuit 350 to data bus 362 that is written to flash memory device 310 in accordance with the combination of address 314 and interface control signals 318. The error code is ultimately written to a selected region of flash memory device 310 (e.g., the region identified as error code 313). Access controller circuit 370 maintains a table indicating which blocks in flash memory device have corresponding error code, and which do not. Thus, during a read of flash memory device 310, access controller circuit 370 is able to indicate to data read circuit 320 via control signals 372 whether error code will be available or not.

De-allocation controller circuit 374 provides for de-allocating memory regions when they are no linger actively in use by updating an allocation table (not shown) that is included as part of access controller circuit 370. In some cases, in addition to identifying a give region as de-allocated, de-allocation controller circuit utilizes heath status information provided via health status determination circuit 380 and signal set 373 to determine whether a region of memory is an error encoded region or a non-error encoded region. This status is also updated to the allocation table maintained as part of access controller circuit 370.

Allocation controller circuit 376 is operable to identify regions within flash memory device 310 that are of the same status (i.e., error encoded or non-error encoded) and are of sufficient size to receive a write data set including, where applicable, a corresponding error code. To do this, allocation controller circuit 376 queries the allocation table maintained as part of access controller circuit 370 using a signal set 375.

In a write operation, the host provides a write location via address 304 and an indication that a write is desired by appropriately asserting read/write request signal 308. In addition, the host provides a block of data to be written to flash memory device 310 via data in interface 306. Error code encoding circuit 350 performs the implemented error code algorithm to generate an error code. The error code is provided to error code write circuit 337 via interface 354, and the originally received data block is provided to data out circuit 335 via interface 352.

In addition, access controller circuit 370 requests a determination by de-allocation controller circuit 374 as to whether the received data is newly written data, or whether the received data supersedes a data set maintained in flash memory device 310 (i.e., the write data was earlier read from flash memory device 310, modified, and is being written back to flash memory device 310). Where de-allocation controller circuit 374 determines that the write data was previously written, de-allocation controller circuit 374 de-allocates the region of flash memory device 310 that held the previous version of the write data. This may include, for example, updating the allocation table maintained by access controller circuit 370 via signal set 373. In addition, de-allocation controller circuit 374 uses heath status information from heath status determination circuit 380 to determine whether the recently de-allocated region is healthy. This may include, for example, determining whether the percentage of good cells within the block is above a defined threshold. Where the region is not healthy, de-allocation controller circuit 374 updates the allocation table to indicate that the block is an error encoded block. Otherwise, de-allocation controller circuit 374 updates the allocation table to indicate that the block is a non-error encoded block.

Next, an un-allocated region of flash memory device 310 of sufficient size to hold the data and of the same status is identified by allocation controller circuit 376. Where the identified region is an error encoded region, access controller circuit 370 commands data write circuit 330 to write both the original write data and the error code data to the region. Alternatively, where the identified region is a non-error encoded region, access controller circuit 370 commands data write circuit 330 to write only the write data to the region.

In a read operation, the host provides a read location via address 304 and an indication that a read is desired by appropriately asserting read/write request signal 308. Access controller circuit 370 translates address 304 into the appropriate block address using processes known in the art, and provides the block address as address 314 along with a read indicator via interface control signals 318. When the requested read data is available on data buses 362, 312, access controller circuit 370 indicates the availability to data read circuit 320 causing data in circuit 325 to access the information from data bus 362.

In addition, access controller circuit 370 queries its internal table to determine whether error code is available for the block that is to be read. Where no error code is available, such is indicated to data read circuit 320 via control signals 372 causing error code read circuit 327 to indicate the unavailability of error code to error code decoding circuit 340. In this situation, error code decoding circuit 340 pulls data from data in circuit 325 and provides it unmodified to the host via data out interface 302. Alternatively, where error code is available, such is indicated to data read circuit 320 via control signals 372 causing error code read circuit 327 to access the error code from data bus 362 and to provide the error code to error code decoding circuit 340. In this situation, error code decoding circuit 340 pulls data from data in circuit 325 and performs the implemented error code decoding algorithm to correct any errors in the data received from data in circuit 325. The error corrected data from data in circuit 325 is then provided to the host via data out interface 302.

Figure 4:
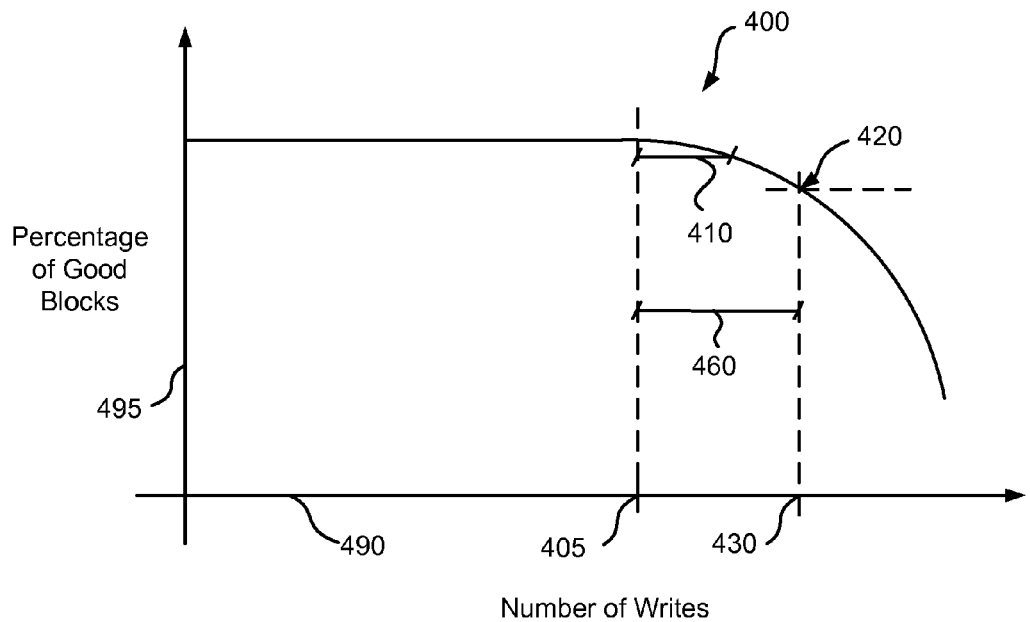
FIG. 4 graphically depicts the lifecycle of a flash memory device or system where the flash memory is augmented by a form of error correction encoding in accordance with some embodiments of the present invention.

Turning to FIG. 4, a graph 400 depicts the extended lifecycle of a flash memory device utilizing an error encoder/decoder circuit on the front end in accordance with one or more embodiments of the present invention. In particular, graph 400 depicts the relationship between a percentage of remaining good blocks 495 in the flash memory device verses the number of writes 490 to the flash memory device. As shown, the percentage of remaining good blocks remains relatively constant until the number of writes reaches a value 405. At this point, the percentage of good blocks begins to decrease in proportion to the number of writes. By standard replacement of exhausted blocks with backup blocks, the lifecycle of the flash memory device is extended by a number of writes indicated as a period 410.

Sometime before the number of backup blocks are fully used (i.e., at a threshold percentage of remaining good blocks), an error code is stored in the flash memory device in relation to data written to the flash memory device. These added error codes allow for error correction of data retrieved from the flash memory device. Such error correction allows for data reliability for an extended period (i.e., period 460 less period 410), and for data reliability where the percentage of remaining good blocks falls to a level 420.

Figure 5:
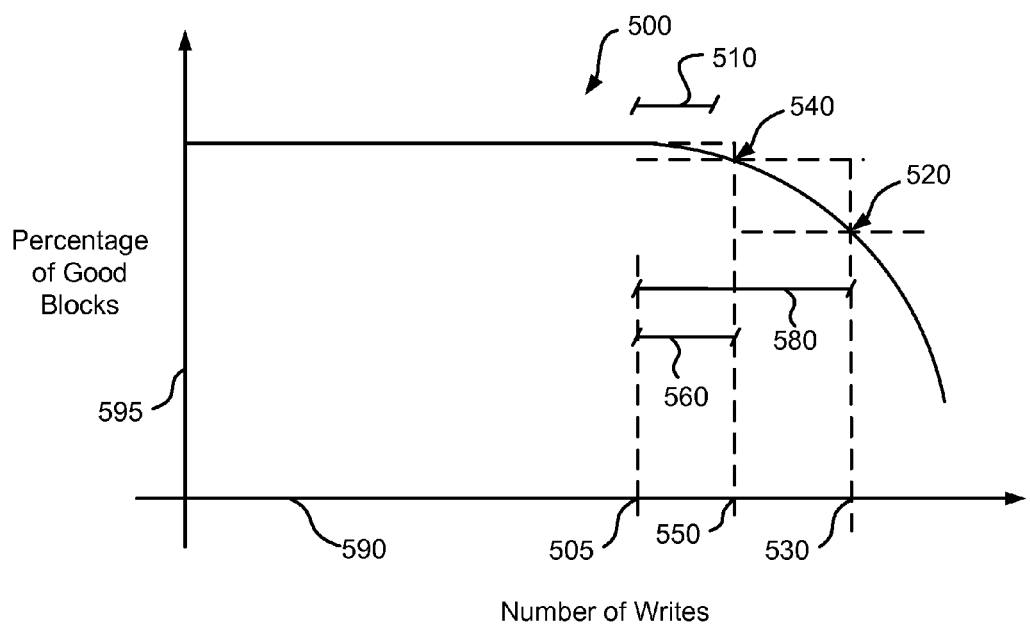
FIG. 5 graphically depicts the lifecycle of a flash memory device or system where the flash memory is augmented by two forms of error correction encoding in accordance with various embodiments of the present invention.

Turning to FIG. 5, a graph 500 depicts the extended lifecycle of a flash memory device utilizing two forms of error correction encoding in accordance with various embodiments of the present invention. In this case, a flash access circuit on the front end of a flash memory device may implement Reed Solomon error correction encoding/decoding, and the flash memory device itself may implement an internal BCH error correction encoding/decoding as is known in the art. Based on the disclosure provided herein, one of ordinary skill in the art will recognize other combinations of error correction encoding/decoding that may be used in relation to different embodiments of the present invention. In particular, graph 500 depicts the relationship between a percentage of remaining good blocks 595 in the flash memory device verses the number of writes 590 to the flash memory device. As shown, the percentage of remaining good blocks remains relatively constant until the number of writes reaches a value 505. At this point, the percentage of good blocks begins to decrease in proportion to the number of writes. By standard replacement of exhausted blocks with backup blocks, the lifecycle of the flash memory device is extended by a number of writes indicated as a period 510. The internal error correction encoding/decoding by the flash memory device allows an extension of lifecycle until a percentage of remaining good blocks falls to a value 540 (corresponding to a number 550 of writes to the flash memory device).

Sometime before the number of backup blocks are fully used and the ability of the error correction encoding/decoding internal to the flash memory device is exhausted (i.e., at a defined threshold percentage of remaining good blocks), error code is stored in the flash memory device in relation to data written to the flash memory device. These added error codes allow for error correction of data retrieved from the flash memory device. Such error correction allows for data reliability for an extended period (i.e., period 580 less period 560), and for data reliability where the percentage of remaining good blocks falls to a level 520.

In conclusion, the invention provides novel systems, devices, methods and arrangements for flash memory usage. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for accessing a memory device, the method comprising:
   providing a non-volatile memory device, the non-volatile memory device having a plurality of memory regions;
   identifying a subset of the plurality of memory regions as un-allocated;
   determining a health status of the subset of the plurality of memory regions; and
   based at least in part on the health status of the subset of the plurality of memory regions, identifying the subset of the plurality of memory regions as an error encoded region.

2. The method of claim 1, wherein the plurality of the memory regions are flash memory regions.

3. The method of claim 1, wherein the subset of the plurality of memory regions is a first of the plurality of memory regions, wherein the error encoded region is a first error encoded region, and wherein the method further comprises:
   receiving a data set;
   identifying a second of the plurality of memory regions that is un-allocated;
   determining that the second of the plurality of memory regions is a second error encoded region;
   performing an error code encoding algorithm on the data set to yield an error code; and writing the data set and the error code to the second error encoded region.

4. The method of claim 3, wherein the error code encoding algorithm is a Reed Solomon error correction encoding algorithm.

5. The method of claim 3, wherein the method further comprises:
allocating a portion of the second of the plurality of memory regions to receive the data set, wherein the portion of the second of the plurality of memory regions is the size of the data set plus the error code.

6. The method of claim 1, wherein the subset of the plurality of memory regions is a first of the plurality of memory regions, and wherein the method further comprises:
receiving a data set;
identifying a second of the plurality of memory regions that is un-allocated;
determining that the second of the plurality of memory regions is a non-error encoded region; and
writing the data set to the second error encoded region.

7. The method of claim 6, wherein the method further comprises:
allocating a portion of the second of the plurality of memory regions to receive the data set, wherein the portion of the second of the plurality of memory regions is the size of the data set.

8. The method of claim 1, wherein the subset of the plurality of memory regions is a first of the plurality of memory regions, and wherein the method further comprises:
receiving a read request;
identifying a second of the plurality of memory regions holding the data set corresponding to the read request;
determining that the second of the plurality of memory regions is a non-error encoded region; and
accessing the data set from the second portion of the plurality of memory regions.

9. The method of claim 1, wherein the subset of the plurality of memory regions is a first of the plurality of memory regions, wherein the error encoded region is a first error encoded region, and wherein the method further comprises:
receiving a read request;
identifying a second of the plurality of memory regions holding the data set corresponding to the read request;
determining that the second of the plurality of memory regions is a second error encoded region;
accessing the data set and a corresponding error code from the second portion of the plurality of memory regions; and
performing an error code decoding using the data set and the error code, wherein at least one bit of the data set is corrected.

10. The method of claim 9, wherein the error code decoding algorithm is a Reed Solomon error correction decoding algorithm.

11. The method of claim 1, wherein the health status of the subset of the plurality of memory regions is selected from a group consisting of: a number of remaining good blocks in the first of the plurality of memory regions, a percentage of remaining good blocks in the first of the plurality of good regions, and a percentage of remaining good cells in the first of the plurality of good regions.

12. A method for accessing a memory device, the method comprising:
receiving a data set;
identifying a subset of a plurality of memory regions that is un-allocated;
determining that the subset of the plurality of memory regions is an error encoded region;
based at least in part on determining that the subset of the plurality of memory regions is an error encoded region, selectively performing an error code encoding algorithm on the data set to yield an error code; and
writing the data set and the error code to the error encoded region.

13. The method of claim 12, wherein the plurality of the memory regions are flash memory regions.

14. The method of claim 12, the method further comprising:
determining a health status of the subset of the plurality of memory regions; and
based at least in part on the health status of the subset of the plurality of memory regions, indicating the subset of the plurality of memory regions as the error encoded region.

15. A memory system, the memory system comprising:
a plurality of flash memory regions;
an access circuit operable to:
identify a subset of the plurality of flash memory regions as un-allocated;
determine a health status of the subset of the plurality of flash memory regions; and
indicate the subset of the plurality of memory regions as an error encoded region based at least in part on the health status of the subset of the plurality of memory regions.

16. The memory system of claim 15, wherein the subset of the plurality of flash memory regions is a first of the plurality of flash memory regions, wherein the error encoded region is a first error encoded region, and wherein the access circuit is further operable to:
receive a data set;
identify a second of the plurality of flash memory regions that is un-allocated;
determine that the second of the plurality of flash memory regions is a second error encoded region;
performing an error code encoding algorithm on the data set to yield an error code;
writing the data set and the error code to the second error encoded region.

17. The memory system of claim 16, wherein the error code encoding algorithm is a Reed Solomon error correction encoding algorithm.

18. The memory system of claim 15, wherein the subset of the plurality of flash memory regions is a first of the plurality of flash memory regions, and wherein the access circuit is further operable to:
receive a data set;
identify a second of the plurality of flash memory regions that is un-allocated;
determine that the second of the plurality of flash memory regions is a non-error encoded region; and
writing the data set to the second error encoded region.

19. The memory system of claim 18, wherein the access circuit is further operable to:
allocate a portion of the second of the plurality of memory regions to receive the data set, and wherein the portion of the second of the plurality of memory regions is the size of the data set.

20. The memory system of claim 15, wherein the subset of the plurality of flash memory regions is a first of the plurality of flash memory regions, and wherein the access circuit is further operable to:
receive a read request;
identify a second of the plurality of memory regions holding the data set corresponding to the read request;

determine that the second of the plurality of memory regions is a second error encoded region;
access the data set and a corresponding error code from the second portion of the plurality of memory regions; and
perform an error code decoding using the data set and the error code, wherein at least one bit of the data set is corrected.

* * * * *